United States Patent
Wang

(10) Patent No.: US 7,214,091 B1
(45) Date of Patent: May 8, 2007

(54) AUDIO/VIDEO MAINFRAME SHAPED AS AN AUTO HEAD

(75) Inventor: Robert Wang, Taoyuan (TW)

(73) Assignee: Ceramate Technical Co., Ltd., Taoyuan (TW)

( * ) Notice: Subject to any disclaimer, the term of this patent is extended or adjusted under 35 U.S.C. 154(b) by 0 days.

(21) Appl. No.: 11/327,499

(22) Filed: Jan. 9, 2006

(51) Int. Cl.
H01R 13/44 (2006.01)

(52) U.S. Cl. .................. 439/491; 439/142; 439/944

(58) Field of Classification Search ............... 439/142, 439/491, 916, 944
See application file for complete search history.

(56) References Cited

U.S. PATENT DOCUMENTS

| | | | |
|---|---|---|---|
| 6,461,189 B1 * | 10/2002 | Koh | 439/491 |
| 6,488,530 B2 * | 12/2002 | Ohlsson | 439/491 |
| 6,752,649 B2 * | 6/2004 | Arkin et al. | 439/491 |
| 6,785,131 B2 * | 8/2004 | Ewell et al. | 361/686 |
| 6,908,334 B2 * | 6/2005 | Huang | 439/491 |
| 6,976,868 B2 * | 12/2005 | Hsu et al. | 439/491 |
| 6,997,738 B1 * | 2/2006 | Sutherland | 439/488 |
| 7,091,421 B2 * | 8/2006 | Kukita et al. | 174/112 |
| 2005/0202879 A1 * | 9/2005 | Hussaini et al. | 463/47 |
| 2005/0259523 A1 * | 11/2005 | Kang | 369/2 |
| 2006/0040081 A1 * | 2/2006 | Hodsdon et al. | 428/40.1 |
| 2006/0209012 A1 * | 9/2006 | Hagood | 345/109 |
| 2006/0236326 A1 * | 10/2006 | Aguirre | 719/322 |

* cited by examiner

Primary Examiner—James R. Harvey
(74) Attorney, Agent, or Firm—Troxell Law Office, PLLC

(57) ABSTRACT

An audio/video mainframe shaped as an auto head includes mainly a frame shell with a front side shaped as an auto front head. Plural A/V output/input terminals and a power terminal are located at two corners of an upper section of the front side, able to be covered by two covers respectively. Two speakers shaped as grilles are placed between the covers. Therefore, it can save the space effectively for the frame shell by setting the A/V output/input terminals 30 and the power terminal 50 at the corners of the front side, and it is very convenient for peripheral lines and a power line to plug into terminals from any direction according to practical need. Further, the A/V output/input terminals and the power terminal can be hidden by the covers, providing an integrated appearance.

3 Claims, 3 Drawing Sheets

AUDIO/VIDEO MAINFRAME SHAPED AS AN AUTO HEAD

BACKGROUND OF THE INVENTION

1. Field of the Invention

This invention relates to an audio/video mainframe, particularly to one that is shaped as an aesthetic auto front head, provided with very convenient terminals for peripheral lines and a power line to plug in.

2. Description of the Prior Art

A common conventional audio/video mainframe, particular to one installed in a car, always includes a frame shell that is installed with a display panel, plural A/V output/input terminals, a power terminal, an antenna and at least a speaker. But, the A/V output/input terminals and the power terminal is located either on the front surface or on the side surface and exposed barely. It looks not only so unsmooth or unbeautiful, but also is inconvenient for peripheral lines or a power line to connect with.

SUMMARY OF THE INVENTION

The prime object of this invention is to offer an audio/video mainframe shaped as an auto's head.

The main characteristic of the invention is a mainframe with a front side shaped an a auto front head and installed with A/V output/input terminals and a power terminal at two corners on an upper section of the front side, able to be covered by two covers correspondingly. Two speakers shaped as grilles are placed between the two covers. Accordingly, such an aesthetic integrated audio/video mainframe can not only keep the A/V output/input terminals and the power terminal from being seen, but also enables the A/V output/input terminals and the power terminal to be plugged in by peripheral lines and a power line coming from various directions, convenient for using.

BRIEF DESCRIPTION OF DRAWINGS

This invention is better understood by referring to the accompanying drawings, wherein.

DETAILED DESCRIPTION OF THE PREFERRED EMBODIMENT

Figure 1:
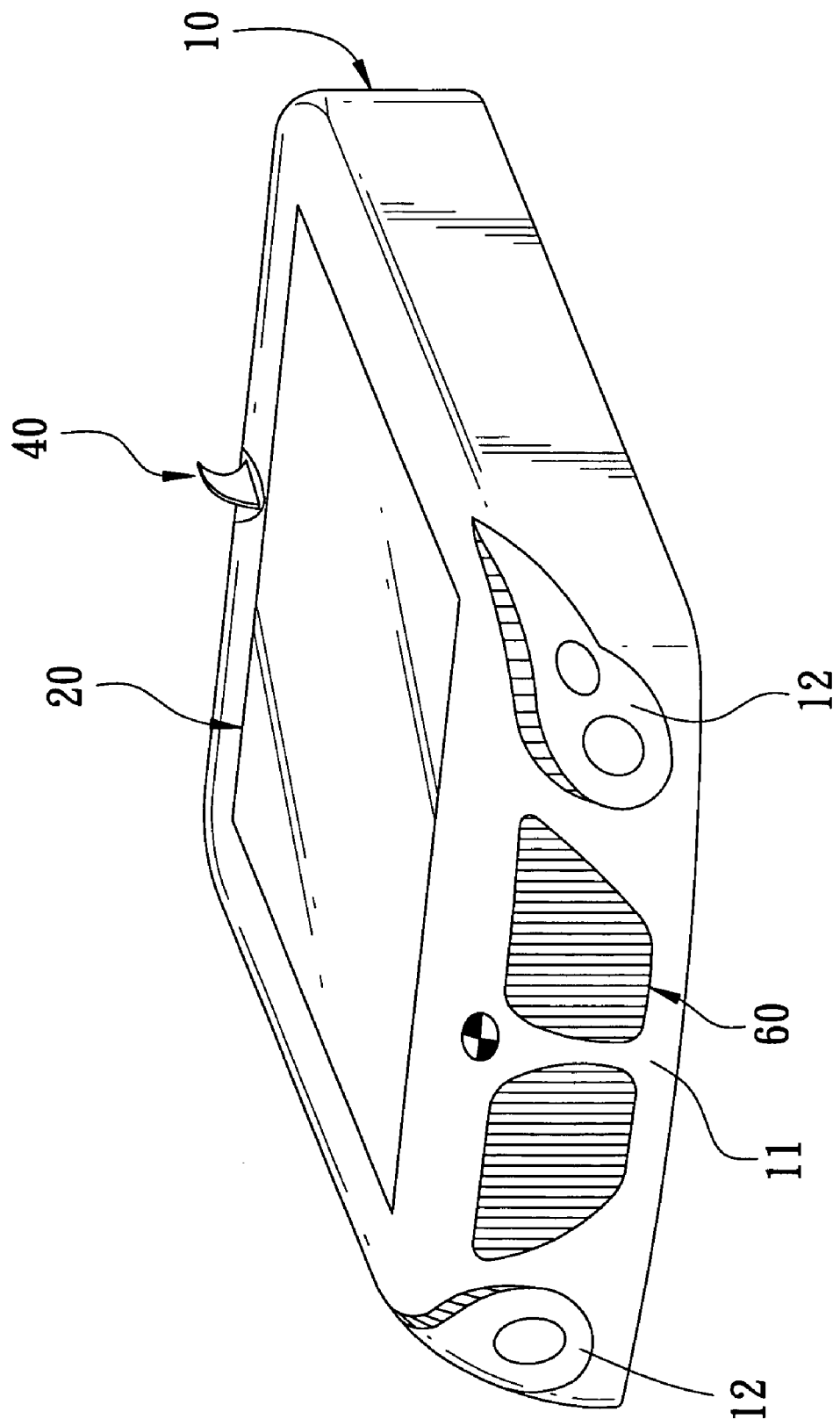
FIG. 1 is a perspective view of a preferred embodiment of an audio/video mainframe shaped as an auto front head in the present invention.
Figure 2:
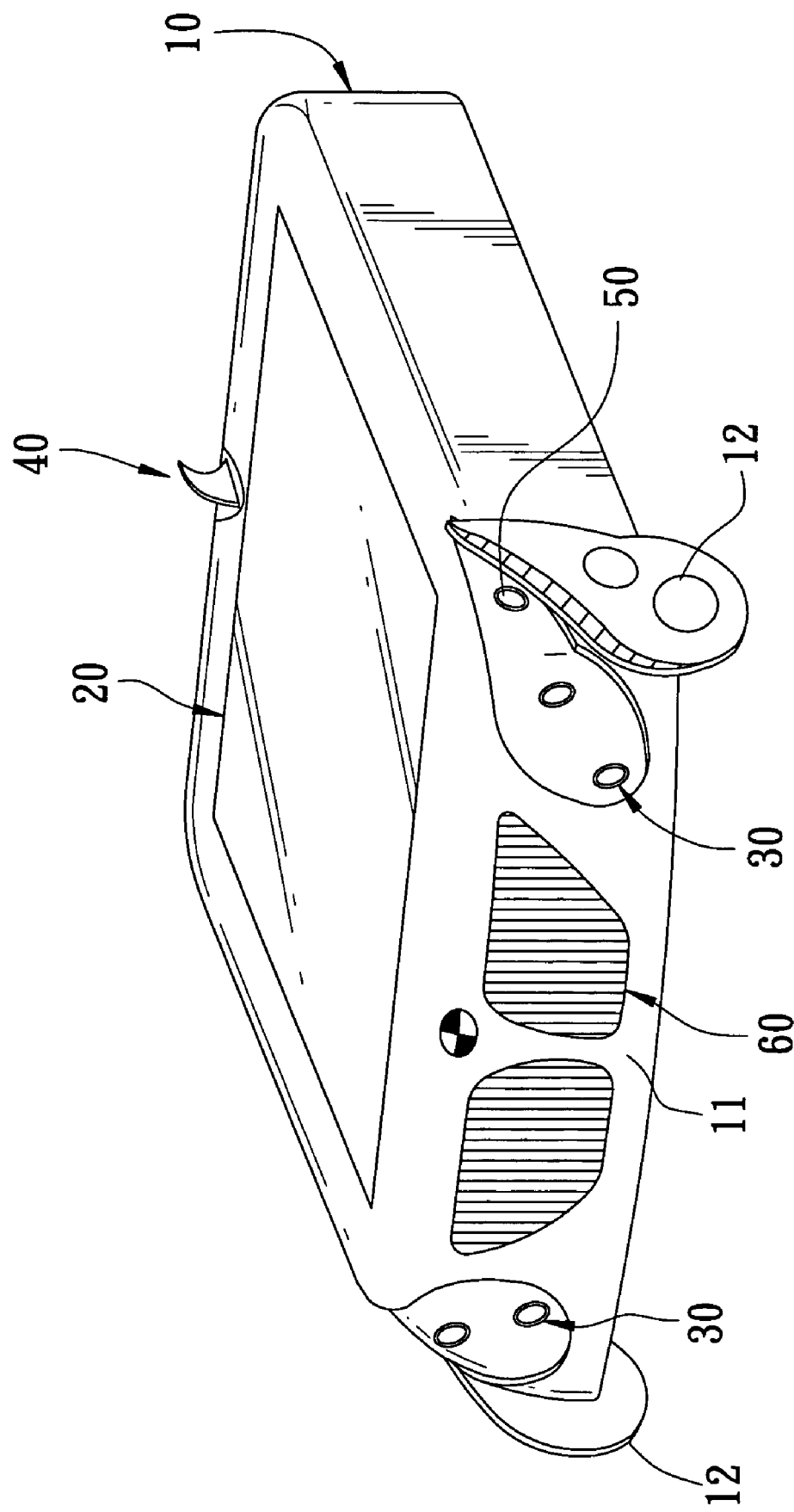
FIG. 2 is a perspective view of the preferred embodiment of an audio/video mainframe shaped as an auto head in the present invention, showing its two covers being raised.

As shown in FIGS. 1 and 2, a preferred embodiment of an audio/video mainframe shaped as an auto head in the present invention includes a frame shell 10 that is at least installed with a display panel 20, plural A/V output/input terminals 30, an antenna 40, a power terminal 50 and two speakers 60.

The frame shell 10 possesses a front side 11 shaped as an auto's front head. Two corners on an upper section of the front side 11 are respectively provided with a cover 12 shaped as a headlight and covering on three adjacent surfaces, able to be raised.

The display panel 20 is set on the top surface of the frame shell 10.

The A/V output/input terminals 30 set respectively at the two upper corners of the front side 11 of the mainframe 10 can be covered by the covers 12 correspondingly.

The antenna 40 is fixed on an intermediate portion of a rear side of the display panel 20.

The power terminal 50 set at any of the two corners of the front side 11 is able to be covered by the cover 12 correspondingly.

The speakers 60 placed between the covers 12 are shaped as a grille respectively.

Figure 3:
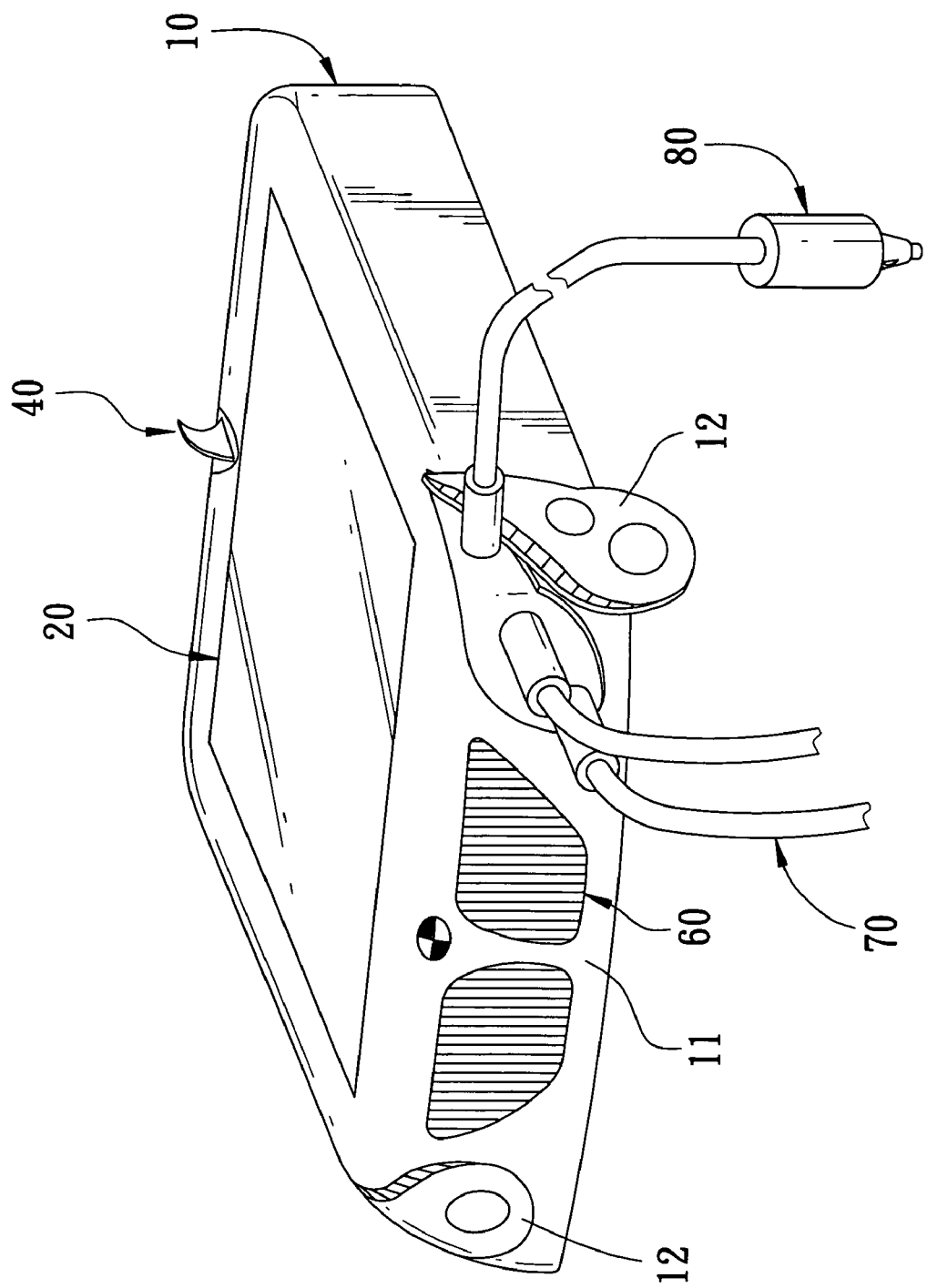
FIG. 3 is a perspective view of the preferred embodiment of an audio/video mainframe shaped as an auto head in the present invention, showing it connected with peripheral lines and a power line.

It should be emphasized that the frame shell 10 provided with the A/V output/input terminals 30 hidden by the covers 12, the power terminal 50, the speakers 60 and the antenna 40 shaped as a shark's fin can display an integral beauty as a whole. In addition, it can save space effectively for the frame shell 10 by setting the A/V output/input terminals 30 and the power terminal 50 at the upper corners of the front side 11, and it is very convenient for peripheral lines 70 and a power line 80 to plug terminals from any direction according to practical need, as shown in FIG. 3. Further, the A/V output/input terminals 30 and the power terminal 50 are not exposed, covered by the covers 12 while not in using, providing an integrated view.

While the preferred embodiment of the invention has been described above, it will be recognized and understood that various modifications may be made therein and the appended claims are intended to cover all such modifications that may fall within the spirit and scope of the invention.

What is claimed is:

1. An audio/video mainframe shaped as an auto head, said mainframe comprising:
    a frame shell having a front side shaped as an auto front head and two covers able to be raised up and positioned at two corners of an upper section of said front side;
    at least a display panel set on a top surface of said frame shell and adjacent to said front side;
    plural A/V output/input terminals located at said two corners of said front side and covered respectively by said covers; and,
    two speakers placed between said covers and shaped as a grille respectively.

2. An audio/video mainframe shaped as an auto head as claimed in claim 1, wherein an antenna is set at an appropriate position adjacent to said display panel.

3. An audio/video mainframe shaped as an auto head as claimed in claim 1, wherein a power terminal is located at any corner of the area covered by said covers.

* * * * *

}